(12) United States Patent
Sirinorakul et al.

(10) Patent No.: US 11,804,416 B2
(45) Date of Patent: Oct. 31, 2023

(54) SEMICONDUCTOR DEVICE AND METHOD OF FORMING PROTECTIVE LAYER AROUND CAVITY OF SEMICONDUCTOR DIE

(71) Applicant: UTAC Headquarters Pte. Ltd., Singapore (SG)

(72) Inventors: Saravuth Sirinorakul, Bangkok (TH); Preecha Joymak, Bangkok (TH); Natawat Kasikornrungroj, Bangkok (TH); Wasu Aingkaew, Bangkok (TH); Kawin Saiubol, Bangkok (TH); Thanawat Jaengkrajarng, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 166 days.

(21) Appl. No.: 17/444,611

(22) Filed: Aug. 6, 2021

(65) Prior Publication Data
US 2022/0077019 A1  Mar. 10, 2022

Related U.S. Application Data

(60) Provisional application No. 63/075,477, filed on Sep. 8, 2020.

(51) Int. Cl.
| | |
|---|---|
| *H01L 23/31* | (2006.01) |
| *H01L 21/56* | (2006.01) |
| *H01L 23/00* | (2006.01) |

(52) U.S. Cl.
CPC ........ *H01L 23/3185* (2013.01); *H01L 21/565* (2013.01); *H01L 24/32* (2013.01);
(Continued)

(58) Field of Classification Search
CPC ..... H01L 23/4951; H01L 24/32; H01L 24/83; H01L 23/3185; H01L 21/565;
(Continued)

(56) References Cited

U.S. PATENT DOCUMENTS

| | | | | |
|---|---|---|---|---|
| 6,306,731 B1 * | 10/2001 | Igarashi | ................. | H01L 21/78 |
| | | | | 257/E21.597 |
| 6,407,363 B2 * | 6/2002 | Dunsky | ................. | B23K 26/08 |
| | | | | 219/121.69 |

(Continued)

*Primary Examiner* — Mouloucoulaye Inoussa
(74) *Attorney, Agent, or Firm* — Robert D. Atkins; PATENT LAW GROUP: Atkins and Associates, P.C.

(57) ABSTRACT

A semiconductor device has a semiconductor die with a sensor and a cavity formed into a first surface of the semiconductor die to provide access to the sensor. A protective layer is formed on the first surface of the semiconductor die around the cavity. An encapsulant is deposited around the semiconductor die. The protective layer blocks the encapsulant from entering the cavity. With the cavity clear of encapsulant, liquid or gas has unobstructed entry into cavity during operation of the semiconductor die. The clear entry for the cavity provides reliable sensor detection and measurement. The semiconductor die is disposed over a leadframe. The semiconductor die has a sensor. The protective layer can be a film. The protective layer can have a beveled surface. A surface of the leadframe can be exposed from the encapsulant. A second surface of the semiconductor die can be exposed from the encapsulant.

20 Claims, 10 Drawing Sheets

(52) U.S. Cl.
CPC .... *H01L 24/83* (2013.01); *H01L 2224/32155* (2013.01); *H01L 2924/10157* (2013.01)

(58) Field of Classification Search
CPC ..... H01L 24/12; H01L 21/6836; H01L 23/28;
H01L 24/19; H01L 24/97; H01L 21/78;
H01L 23/3114; H01L 21/561; H01L
23/49816; H01L 24/96; H01L 23/522;
H01L 21/568; H01L 23/3135; H01L
24/24; H01L 25/0655; H01L 22/12; H01L
24/20; H01L 25/50; H01L 24/82; H01L
23/31; H01L 23/053; H01L 25/0652;
H01L 23/147; H01L 23/3157; H01L
21/486; H01L 24/06; H01L 23/49827;
H01L 23/13; H01L 24/94; H01L 23/3128;
H01L 23/5384; H01L 24/02; H01L
21/76898; H01L 23/562; H01L 23/481;
H01L 25/16; H01L 24/16; H01L 25/18;
H01L 24/11; H01L 24/81; H01L 21/4803;
H01L 24/26; H01L 29/0657; H01L
2224/32155; H01L 2224/32245; H01L
2924/10158; H01L 2224/16245; H01L
2924/18161; H01L 2924/10157; H01L
2924/12042; H01L 2224/0401; H01L
2924/3511; H01L 2224/16225; H01L
2221/68327; H01L 2924/01322; H01L
2224/04105; H01L 2224/12105; H01L
2224/73265; H01L 2924/15174; H01L
2224/32225; H01L 2924/12041; H01L
2924/13091; H01L 2924/15184; H01L
2924/1306; H01L 2224/821; H01L
2224/24011; H01L 2224/8213; H01L
2224/82039; H01L 2224/24101; H01L
2224/97; H01L 2224/82; H01L 2224/19;
H01L 2224/18; H01L 2924/001; H01L
2924/16152; H01L 2924/16235; H01L
2225/06541; H01L 2224/16145; H01L
2224/02372; H01L 2225/06513; H01L
23/49838; H01L 2224/02381; H01L
2924/014; H01L 2224/0556; H01L
2924/00012; H01L 2224/05144; H01L
2924/00014; H01L 2224/05166; H01L
2924/0014; H01L 2224/05155; H01L
2924/01023; H01L 2224/05644; H01L
2924/0105; H01L 2224/05687; H01L
2924/053; G01B 11/272; G01R 31/311;
G01R 31/2894; B81C 1/0023; B81C
2203/0714; B81C 2203/0154; B81B
7/0006; B81B 7/02; B81B 2201/0242;
B81B 2203/0315; B81B 2201/0264;
B81B 2201/0235; B81B 2207/098
USPC ... 257/99, 98, 776, 781, 750, 772, 712, 457,
257/E33.067, E33.066, E33.061; 438/29,
438/51, 113, 106, 50, 909, 401, 465, 87
See application file for complete search history.

(56) References Cited

U.S. PATENT DOCUMENTS

| | | | | |
|---|---|---|---|---|
| 6,521,477 B1 * | 2/2003 | Gooch | ............ | B81B 7/0077 |
| | | | | 438/401 |
| 7,901,971 B2 | 3/2011 | Hunziker et al. | | |
| 8,912,075 B1 * | 12/2014 | Lei | ............ | H01L 21/78 |
| | | | | 438/464 |
| 9,117,868 B1 * | 8/2015 | Nangoy | ............ | H01L 21/67207 |
| 9,466,585 B1 * | 10/2016 | Kamphuis | ............ | H01L 24/94 |
| 9,496,193 B1 * | 11/2016 | Roesner | ............ | H01L 24/32 |
| 9,670,057 B1 | 6/2017 | Oldsen | | |
| 10,549,985 B2 | 2/2020 | Maier et al. | | |
| 2002/0179986 A1 * | 12/2002 | Orcutt | ............ | G01P 1/023 |
| | | | | 257/E23.193 |
| 2004/0113283 A1 * | 6/2004 | Farnworth | ............ | H01L 23/481 |
| | | | | 257/E29.022 |
| 2004/0157410 A1 * | 8/2004 | Yamaguchi | ............ | H01L 23/49805 |
| | | | | 438/460 |
| 2004/0212047 A1 * | 10/2004 | Joshi | ............ | H01L 23/585 |
| | | | | 257/620 |
| 2005/0176166 A1 * | 8/2005 | Chen | ............ | B81B 7/0077 |
| | | | | 438/51 |
| 2006/0185429 A1 * | 8/2006 | Liu | ............ | B60C 23/0408 |
| | | | | 73/146.5 |
| 2008/0284003 A1 * | 11/2008 | Kwang | ............ | H01L 24/83 |
| | | | | 257/E21.502 |
| 2009/0004780 A1 * | 1/2009 | Arita | ............ | H01L 24/743 |
| | | | | 438/114 |
| 2009/0053856 A1 * | 2/2009 | Ohsumi | ............ | H01L 21/56 |
| | | | | 257/E21.499 |
| 2009/0215227 A1 * | 8/2009 | Tan | ............ | H01L 23/3114 |
| | | | | 438/106 |
| 2009/0218660 A1 * | 9/2009 | Utsumi | ............ | B28D 5/0011 |
| | | | | 257/E23.179 |
| 2009/0230487 A1 | 9/2009 | Saitoh et al. | | |
| 2010/0173474 A1 * | 7/2010 | Arita | ............ | H01L 21/6836 |
| | | | | 257/E21.599 |
| 2010/0248451 A1 * | 9/2010 | Pirogovsky | ............ | B23K 26/0624 |
| | | | | 257/E21.599 |
| 2011/0012253 A1 * | 1/2011 | Kwang | ............ | H01L 24/32 |
| | | | | 438/109 |
| 2011/0073889 A1 * | 3/2011 | Sugizaki | ............ | H01L 33/505 |
| | | | | 257/E33.061 |
| 2011/0114978 A1 * | 5/2011 | Kojima | ............ | H01L 33/507 |
| | | | | 257/E33.001 |
| 2011/0204396 A1 * | 8/2011 | Akimoto | ............ | H01L 33/54 |
| | | | | 438/33 |
| 2011/0244629 A1 * | 10/2011 | Gong | ............ | H01L 23/49582 |
| | | | | 438/111 |
| 2011/0291148 A1 * | 12/2011 | Sugizaki | ............ | H01L 33/44 |
| | | | | 257/E33.056 |
| 2011/0291149 A1 * | 12/2011 | Sugizaki | ............ | H01L 33/647 |
| | | | | 257/E33.057 |
| 2011/0297969 A1 * | 12/2011 | Kojima | ............ | H01L 33/50 |
| | | | | 257/E33.013 |
| 2011/0297994 A1 * | 12/2011 | Sugizaki | ............ | H01L 25/0753 |
| | | | | 257/E33.058 |
| 2012/0112351 A1 * | 5/2012 | Walczyk | ............ | H01L 21/78 |
| | | | | 257/772 |
| 2012/0292722 A1 * | 11/2012 | Lin | ............ | B81B 7/007 |
| | | | | 257/E31.124 |
| 2012/0322240 A1 * | 12/2012 | Holden | ............ | B23K 26/364 |
| | | | | 257/E21.602 |
| 2013/0017643 A1 * | 1/2013 | Lin | ............ | B81C 1/00301 |
| | | | | 438/51 |
| 2013/0037935 A1 * | 2/2013 | Xue | ............ | H01L 23/3114 |
| | | | | 257/737 |
| 2013/0161795 A1 * | 6/2013 | Owada | ............ | H01L 21/6835 |
| | | | | 257/E23.179 |
| 2013/0175694 A1 * | 7/2013 | Shih | ............ | H01L 21/568 |
| | | | | 438/126 |
| 2013/0299864 A1 * | 11/2013 | Sugizaki | ............ | H01L 21/28 |
| | | | | 257/98 |
| 2013/0301228 A1 * | 11/2013 | Tao | ............ | H01L 23/49816 |
| | | | | 361/748 |
| 2013/0320381 A1 * | 12/2013 | Kojima | ............ | H01L 33/62 |
| | | | | 257/98 |
| 2013/0320383 A1 * | 12/2013 | Izuka | ............ | H01L 33/62 |
| | | | | 257/98 |
| 2013/0334539 A1 * | 12/2013 | Kojima | ............ | H01L 33/0075 |
| | | | | 438/46 |
| 2014/0017881 A1 * | 1/2014 | Eaton | ............ | H01L 21/30655 |
| | | | | 29/563 |
| 2014/0175471 A1 * | 6/2014 | Akimoto | ............ | H01L 27/156 |
| | | | | 257/91 |

(56) References Cited

U.S. PATENT DOCUMENTS

| | | | |
|---|---|---|---|
| 2014/0191258 A1* | 7/2014 | Akimoto | H01L 33/505 |
| | | | 438/29 |
| 2014/0225204 A1* | 8/2014 | Nakagawa | H04R 19/005 |
| | | | 257/416 |
| 2014/0353772 A1* | 12/2014 | Stermer, Jr. | B81C 1/00325 |
| | | | 438/51 |
| 2014/0367811 A1* | 12/2014 | Nakagawa | B81C 1/00158 |
| | | | 257/416 |
| 2015/0034985 A1* | 2/2015 | Tomizawa | H01L 33/60 |
| | | | 257/98 |
| 2015/0166329 A1* | 6/2015 | Cheng | H01L 24/97 |
| | | | 438/51 |
| 2016/0086852 A1* | 3/2016 | Holden | H01L 21/78 |
| | | | 438/462 |
| 2016/0368762 A1* | 12/2016 | Cheng | B81C 1/0023 |
| 2017/0098612 A1* | 4/2017 | Lin | H01L 23/3107 |
| 2017/0221728 A1* | 8/2017 | Ho | H01L 21/568 |
| 2018/0025949 A1* | 1/2018 | Sohn | H01L 24/24 |
| | | | 356/400 |
| 2018/0342422 A1* | 11/2018 | Li | H01L 21/02076 |
| 2018/0366403 A1* | 12/2018 | Yu | H01L 23/147 |
| 2019/0057900 A1* | 2/2019 | Krishnan | H01L 21/56 |
| 2019/0109048 A1* | 4/2019 | Strothmann | H01L 24/12 |
| 2019/0135614 A1* | 5/2019 | Kierse | B81C 1/00269 |
| 2020/0091001 A1* | 3/2020 | Lei | H01L 21/32137 |
| 2020/0135661 A1* | 4/2020 | Lee | H01L 23/562 |
| 2020/0212271 A1* | 7/2020 | Reingruber | H01L 33/486 |
| 2020/0339412 A1* | 10/2020 | Cheng | B81C 1/0023 |
| 2020/0365408 A1* | 11/2020 | Seddon | H01L 21/568 |
| 2022/0165699 A1* | 5/2022 | Luan | H01L 24/02 |
| 2022/0320063 A1* | 10/2022 | Chou | H01L 24/32 |
| 2022/0359360 A1* | 11/2022 | Lin | H01L 25/0652 |

* cited by examiner

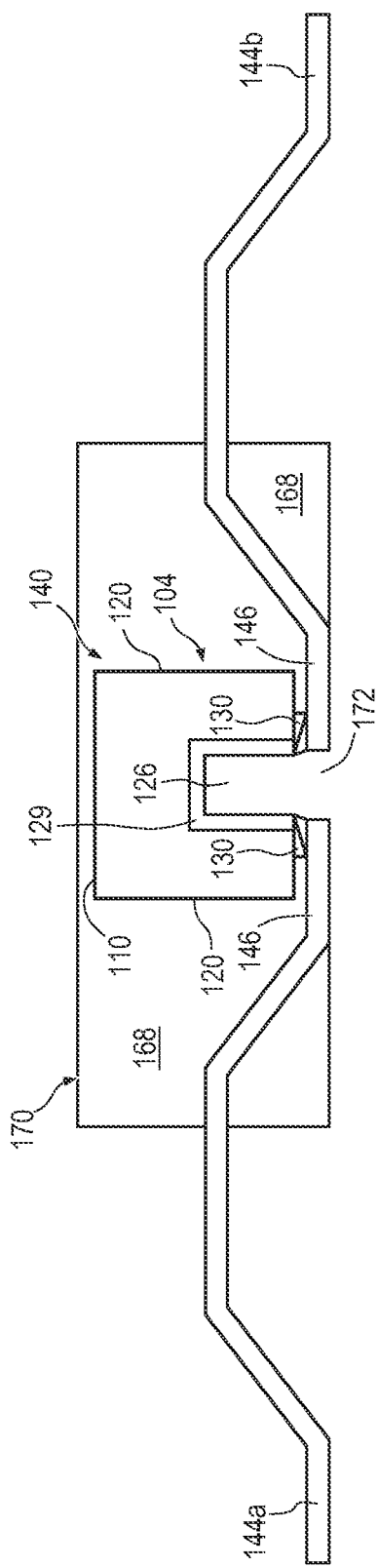
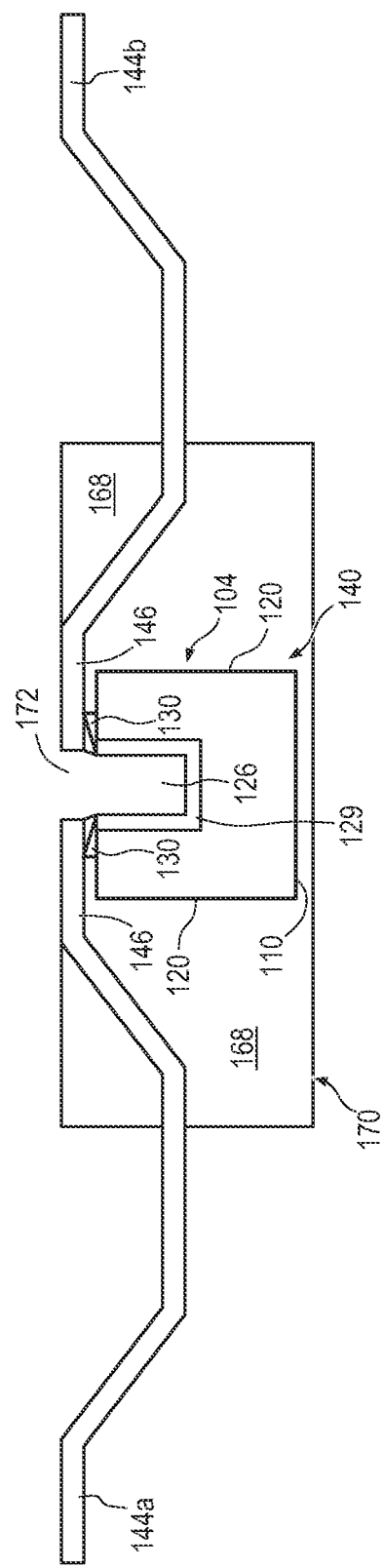
FIG. 9
FIG. 10

SEMICONDUCTOR DEVICE AND METHOD OF FORMING PROTECTIVE LAYER AROUND CAVITY OF SEMICONDUCTOR DIE

CLAIM OF DOMESTIC PRIORITY

The present application claims the benefit of U.S. Provisional Application No. 63/075,477, filed Sep. 8, 2020, which application is incorporated herein by reference.

FIELD OF THE INVENTION

The present invention relates in general to semiconductor devices and, more particularly, to a semiconductor device and method of forming a protective layer around a cavity of a semiconductor die to block entry of encapsulant into the cavity.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor die is typically encapsulated for structural support and environmental protection. Some semiconductor die have areas that are vulnerable to encapsulation. For example, the semiconductor die may have a sensor and a cavity in the substrate extending to the sensor to permit an environmental medium, such as a liquid or gas, to reach and interact with the sensor. The cavity should be free from encapsulant. Any encapsulant in the cavity can restrict or block the environmental medium from reaching the sensor. If the liquid or gas cannot enter the cavity, or is at least partially obstructed from entering the cavity, the sensor will likely have inaccurate readings, limited functionality, and low reliability.

BRIEF DESCRIPTION OF THE DRAWINGS

FIG. 9 illustrates the semiconductor package with the cavity oriented downward; and FIG. 10 illustrates the semiconductor package with the cavity oriented upward.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
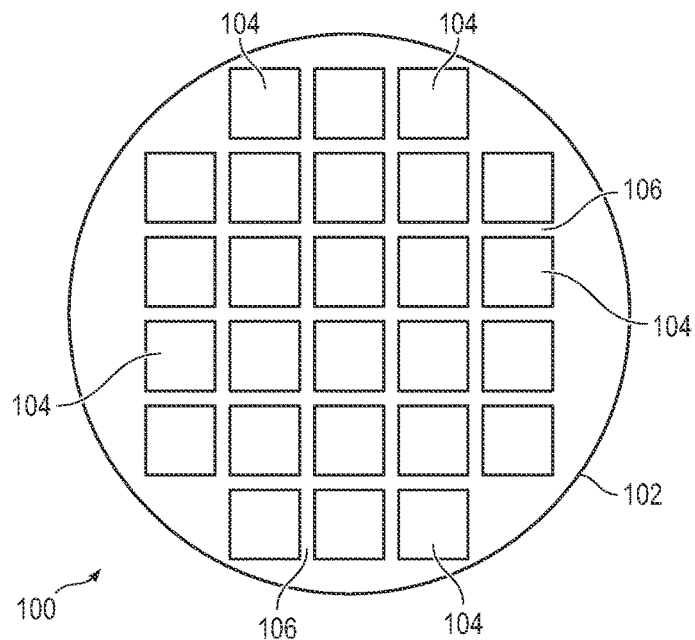
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
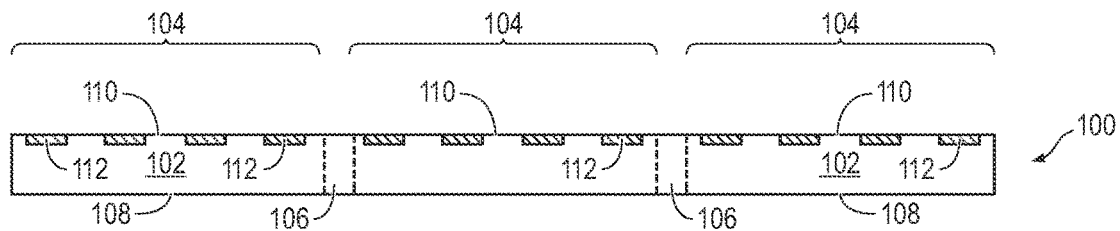

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
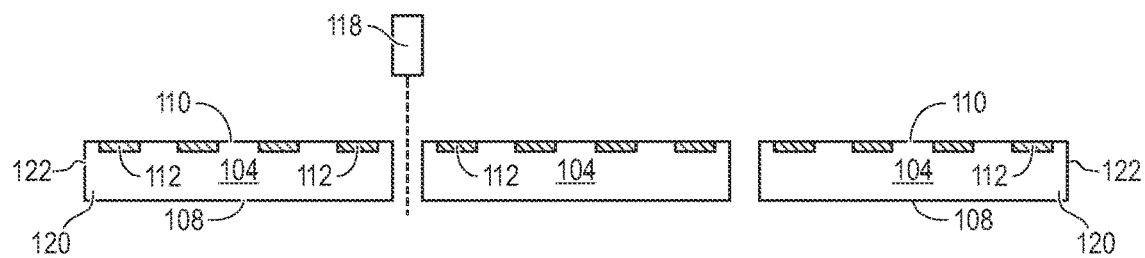

In FIG. 1c, semiconductor wafer 100 is singulated through saw street 106 using a saw blade or laser cutting tool 118 into individual semiconductor die 104. Post singulation semiconductor die 104 has an exposed side surface 120 and exposed side surface 122 adjacent to side surface 120. The individual semiconductor die 104 can be inspected and electrically tested for identification of KGD post singulation.

Figure 2A:
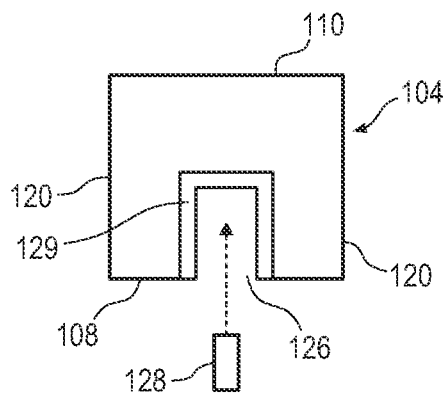
FIGS. 2a-2j illustrate a process of forming a cavity in a semiconductor die and protective layer around the cavity.

FIGS. 2a-2j illustrate a process of forming a cavity in a semiconductor die and a protective layer around the cavity. FIG. 2a shows a cross-sectional view of semiconductor die 104 with cavity 126 formed in back surface 108. Cavity 126 extends from back surface 108 to an interior region of semiconductor die 104. Cavity 126 can be formed by etching, drilling, or direct laser ablation (LDA) with laser 128. In one embodiment, semiconductor die 104 includes sensor region 129 responsive to liquid or gas, e.g., liquid pressure, gas flow rate, liquid composition, etc. Cavity 126 provides a path for the liquid or gas to reach and interact with active sensor components within semiconductor die 104.

Figure 2D:
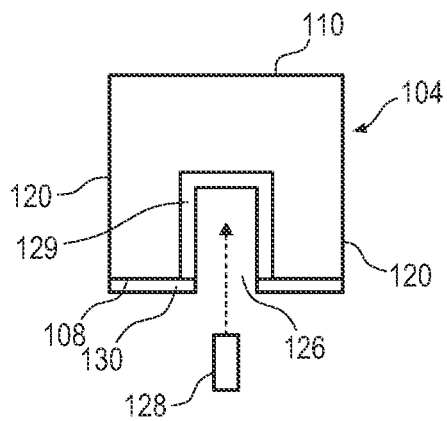
Figure 2B:
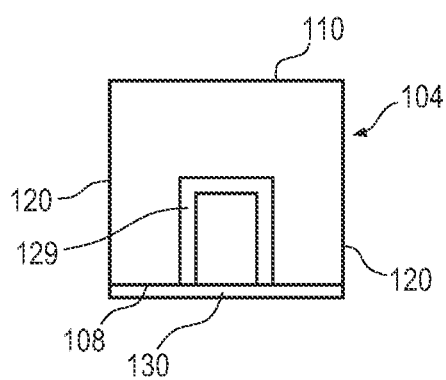

In FIG. 2b, protective layer 130 is formed over back surface 108 and cavity 126. Protective layer 130 can be a film layer, such as polymer, polyimide, silicone, epoxy, dielectric resist, composite resist, laminate compound, insulation paste with filler, solder mask resist, liquid molding compound, granular molding compound, silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), prepreg, metal foil film, metal foil tape, or any other suitable protective film layer. Protective layer 130 can be formed using chemical vapor deposition (CVD), physical vapor deposition (PVD), direct adhesion, electrolytic plating, electroless plating, or other film deposition process.

Figure 2E:
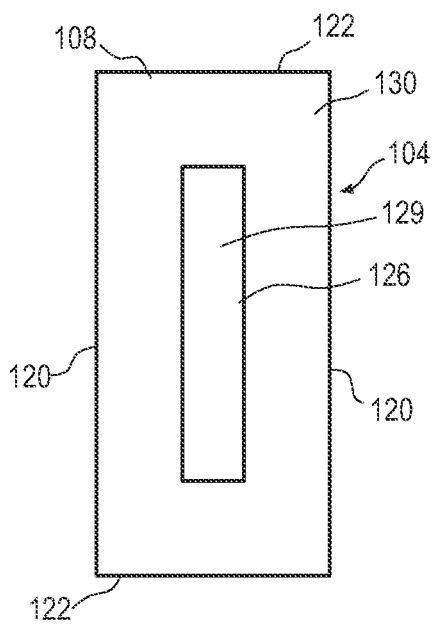
Figure 2C:
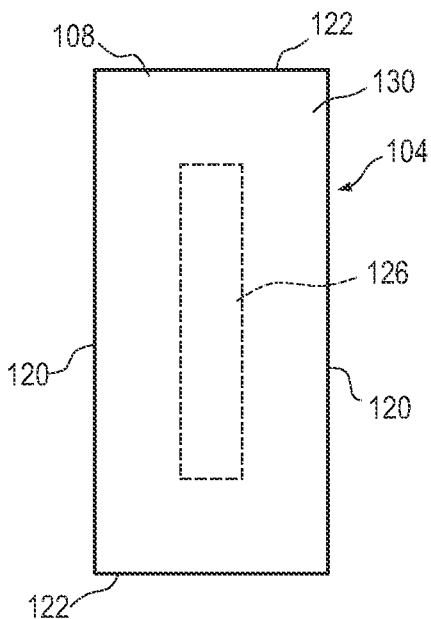

FIG. 2c shows protective layer 130 formed over back surface 108 and cavity 126. In FIG. 2d, a first portion of protective layer 130 is removed to expose cavity 126 and sensor region 129. In one embodiment, the first portion of protective layer 130 is removed by ultraviolet light (UV) exposure, etching, or LDA with laser 128. Elements having a similar function are assigned the same reference number. FIG. 2e shows cavity 126 formed in back surface 108 of semiconductor die 104 with protective layer 130 around a perimeter of the cavity.

Figure 2F:
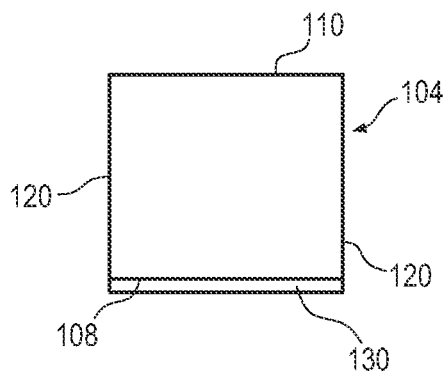

In another embodiment, protective layer 130 is formed prior to cavity 126, as shown in FIG. 2f. Cavity 126 is then formed through protective layer 130 into back surface 108 of semiconductor die 104, providing the same structure as FIG. 2d, 2e with access to sensor region 129. Cavity 126 would be formed by etching or LDA with laser 128.

Figure 2G:
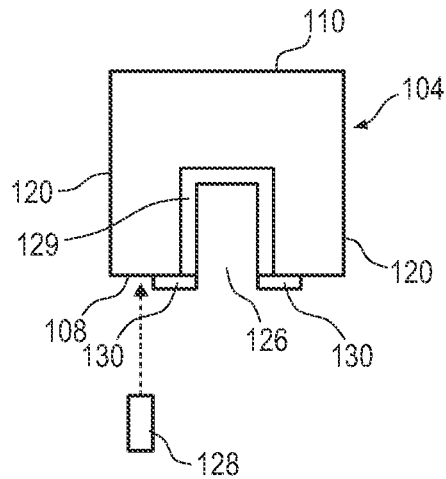

In FIG. 2g, a second portion of protective layer 130 is removed adjacent to side surfaces 120 and 122 around a perimeter of semiconductor die 104 leaving a strip of the protective layer around a perimeter of cavity 126. The second portion of protective layer 130 is removed by UV light exposure, etching, or LDA with laser 128. FIG. 2h shows protective layer 130 remaining around the perimeter of cavity 126. Back surface 108 of semiconductor die 104 is again exposed following removal of the second portion of protective layer 130 adjacent to side surfaces 120 and 122 around a perimeter of semiconductor die 104. Alternatively, protective layer 130 is left covering back surface 108, as in FIG. 2d. In any case, protective layer 130 provides a ring of dam material around the perimeter of cavity 126 to prevent encapsulant or other contaminants from interfering with sensor region 129.

Figure 2I:
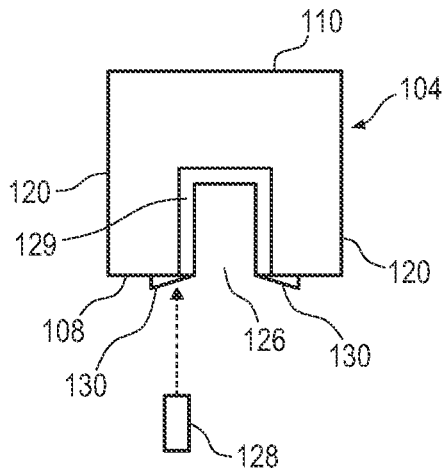
Figure 2H:
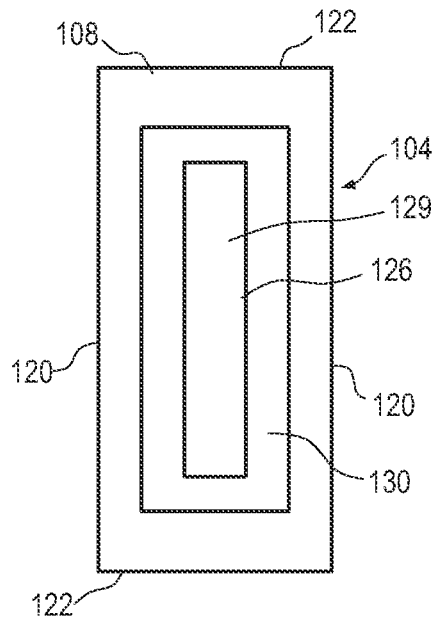
Figure 2J:
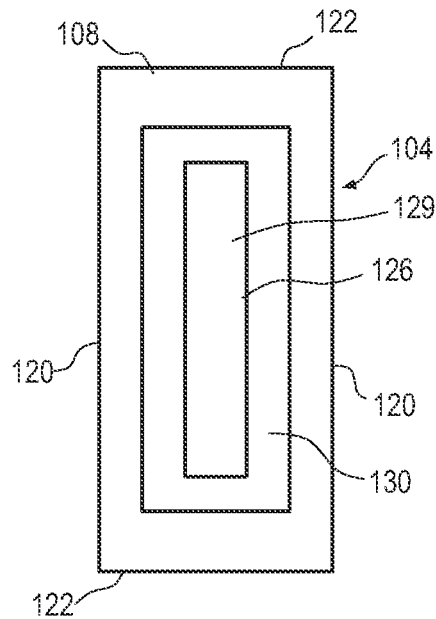

In FIG. 2i, a third portion of protective layer 130 is removed to create a beveled surface decreasing in thickness toward cavity 126 and extending around the perimeter of the cavity. The third portion of protective layer 130 is removed by UV exposure, etching, or LDA with laser 128. FIG. 2j shows the beveled protective layer 130 around the perimeter of cavity 126. The beveled protective layer 130 extends to an edge of cavity 126 to prevent encapsulant or other contaminants from interfering with sensor region 129.

Figure 3A:
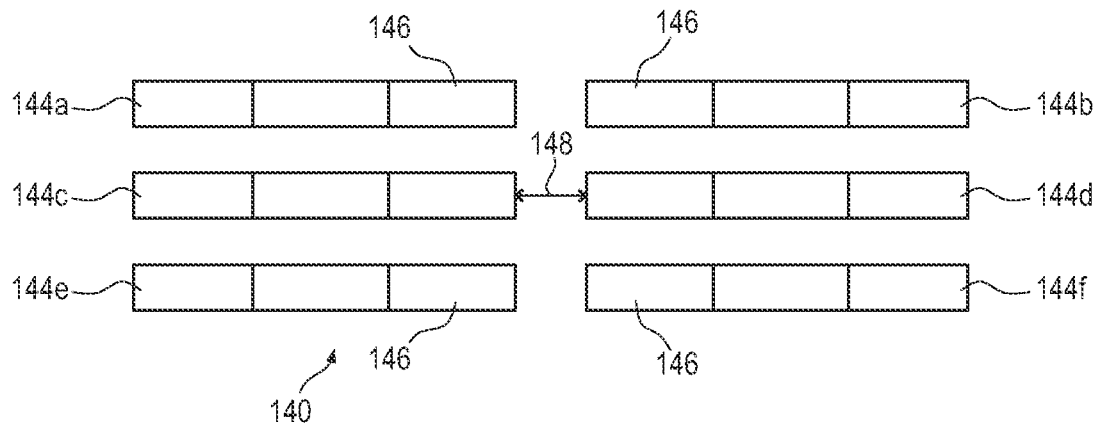
FIGS. 3a-3d illustrate a leadframe for mounting the semiconductor die.
Figure 3B:
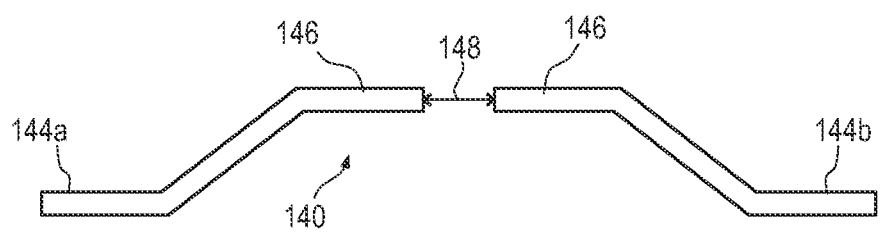
Figure 3C:
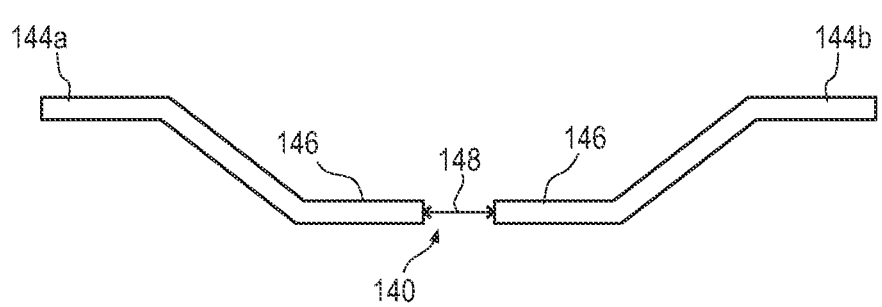
Figure 3D:
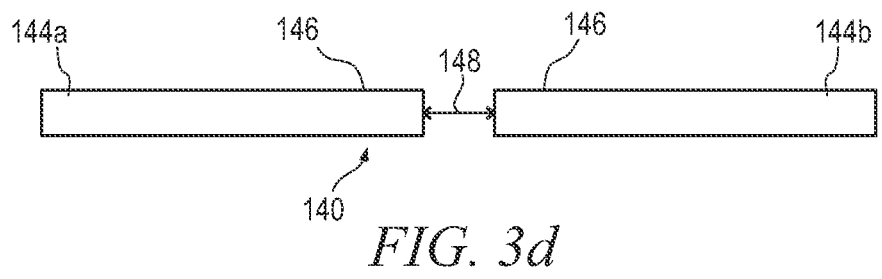

FIGS. 3a-3d illustrate a leadframe for mounting semiconductor die 104. FIG. 3a shows a top view of leadframe 140 with leads 144a-144f extending from die pad 146. Gap 148 separates leads 144a-144b, 144c-144d, and 144e-144f. Gap 148 provides liquid access to cavity 126 in the final assembly. Leads 144a-144f are commonly connected during die mounting and electrically isolated later in the assembly process. FIG. 3b shows a cross-sectional view of a first embodiment of leadframe 140 with leads 144a-144f downset from die pad 146. FIG. 3c shows a cross-sectional view of a second embodiment of leadframe 140 with die pad 146 downset from leads 144a-144f. FIG. 3d shows a cross-sectional view of a third embodiment of leadframe 140 with die pad 146 level with leads 144a-144f.

Figure 4A:
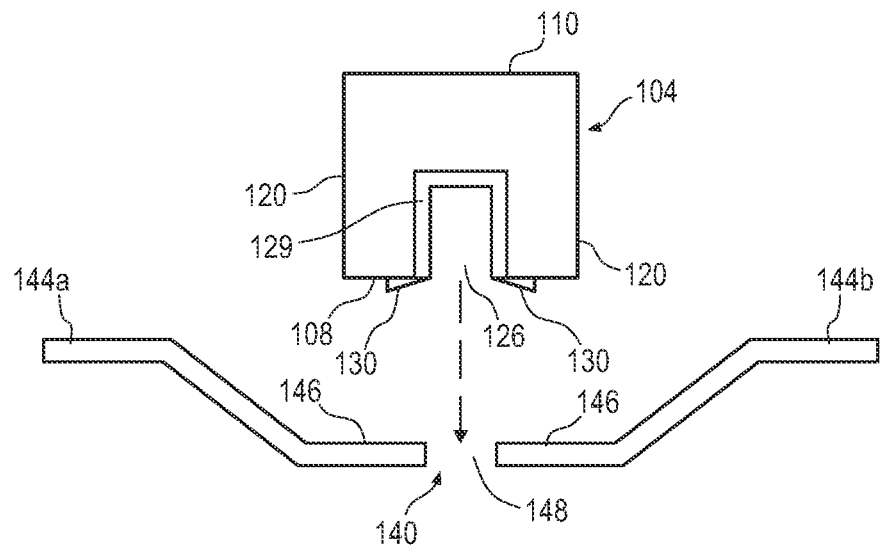
FIGS. 4a-4f illustrate mounting the semiconductor die to the leadframe.
Figure 4B:
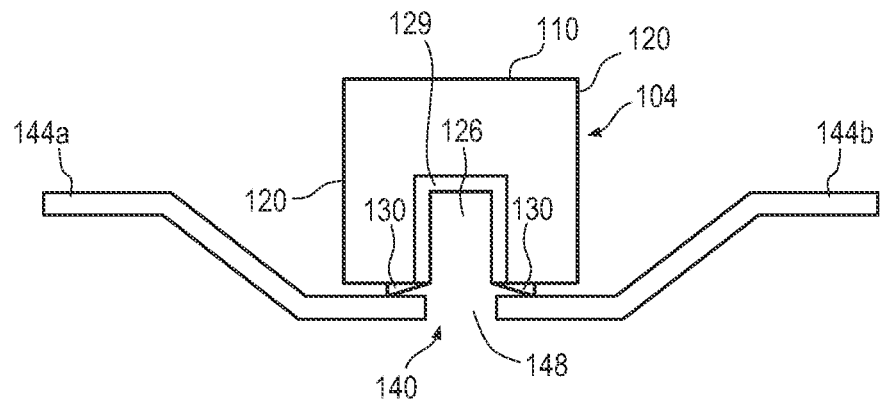
Figure 4C:
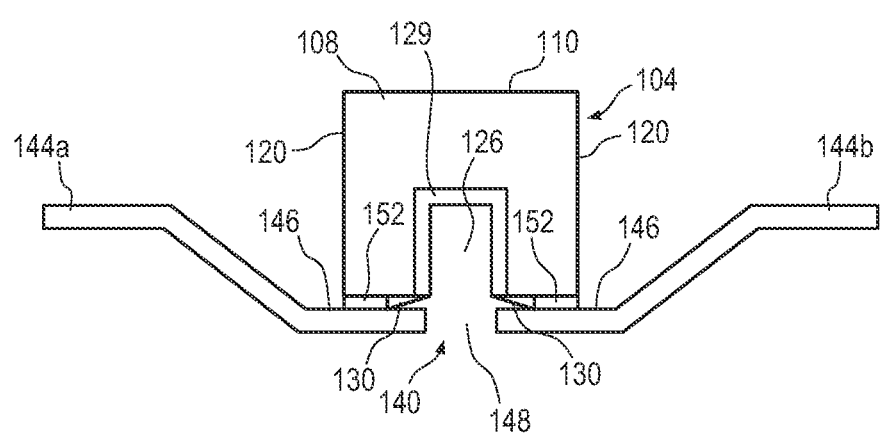
Figure 4D:
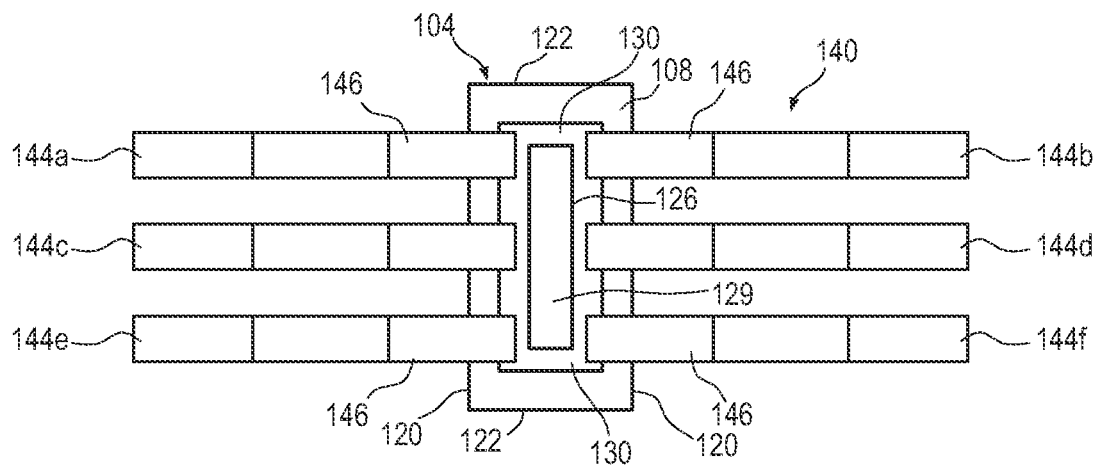
Figure 4E:
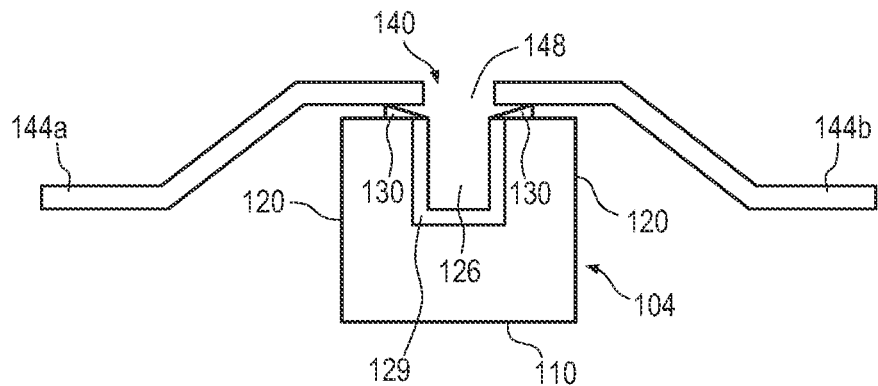
Figure 4F:
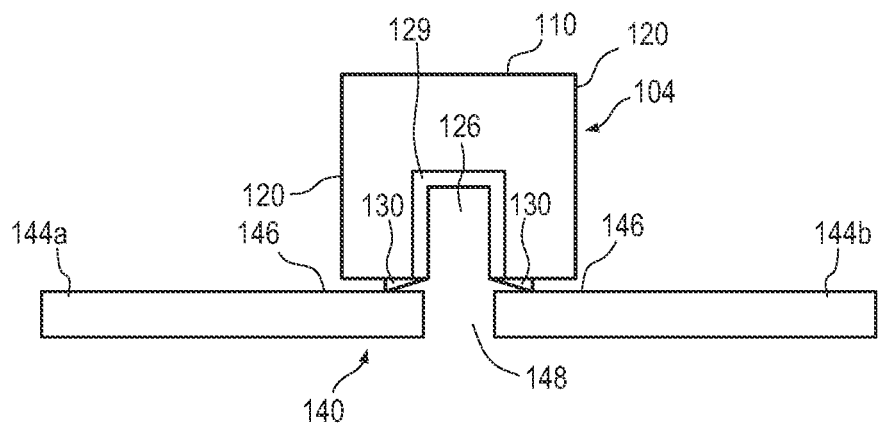

FIGS. 4a-4f illustrate semiconductor die 104 mounted to leadframe 140. FIG. 4a shows semiconductor die 104 positioned over die pad 146 of leadframe 140 with cavity 126 aligned over gap 146 using a pick and place operation. Back surface 108 and cavity 126 of semiconductor die 104 and protective layer 130 are oriented toward die pad 146. FIG. 4b shows semiconductor die 104 mounted to die pad 146. Protective layer 130 bonds semiconductor 104 to leadframe 140. Alternatively, adhesive 152 around protective layer 130 bonds back surface 108 of semiconductor die 104 to die pad 146 of leadframe 140, as shown in FIG. 4c. Cavity 126 is disposed over gap 148 with protective layer 130 contacting die pad 146 to seal off the cavity. Protective layer 130 serves to block or prevent later deposited encapsulant and other contaminants from entering cavity 126 and interfering with sensor region 129, as described below. FIG. 4d shows semiconductor die 104 bonded to leadframe 140. FIG. 4e shows semiconductor die 104 bonded to leadframe 140 with leads 144a-144f downset from die pad 146, as in FIG. 3b. FIG. 4f shows semiconductor die 104 bonded to leadframe 140 with die pad 146 level with leads 144a-144f, as in FIG. 3d.

Figure 5A:
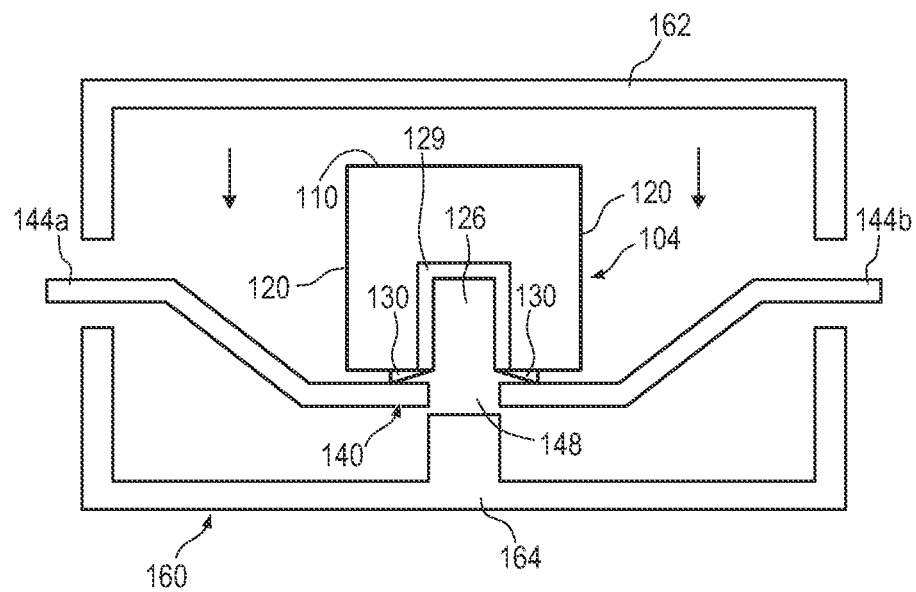
FIGS. 5a-5e illustrate depositing an encapsulant over the semiconductor die as mounted on the leadframe.
Figure 5B:
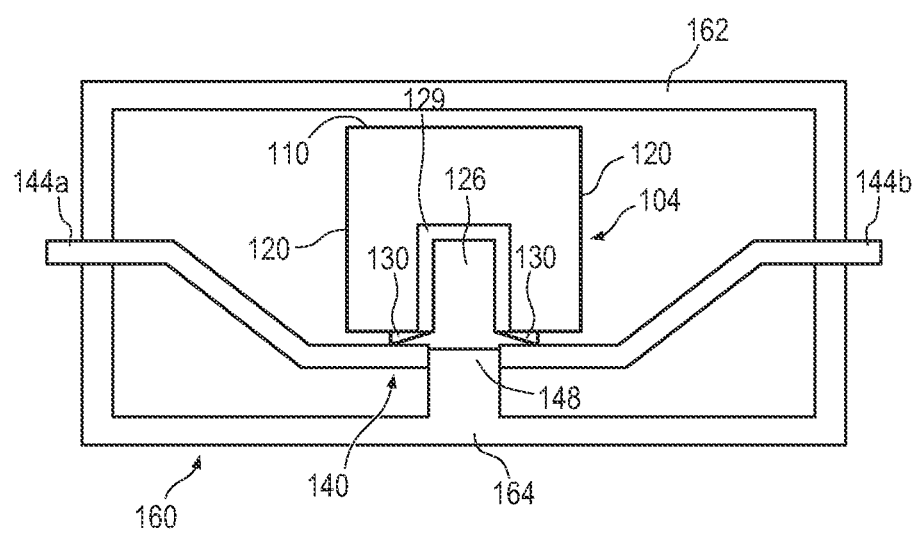

FIGS. 5a-5e illustrate encapsulation of semiconductor die 104 and leadframe 140 by film assisted molding (FAM) process. FIG. 5a shows mold chase 160 with upper mold chase 162 and lower mold chase 164. Semiconductor die 104 as mounted to leadframe 140 is disposed within mold chase 160. In FIG. 5b, upper mold chase 162 and lower mold chase 164 close to contain semiconductor die 104 and leadframe 140. A portion of leads 144a-144f extends from mold chase 160.

Figure 5C:
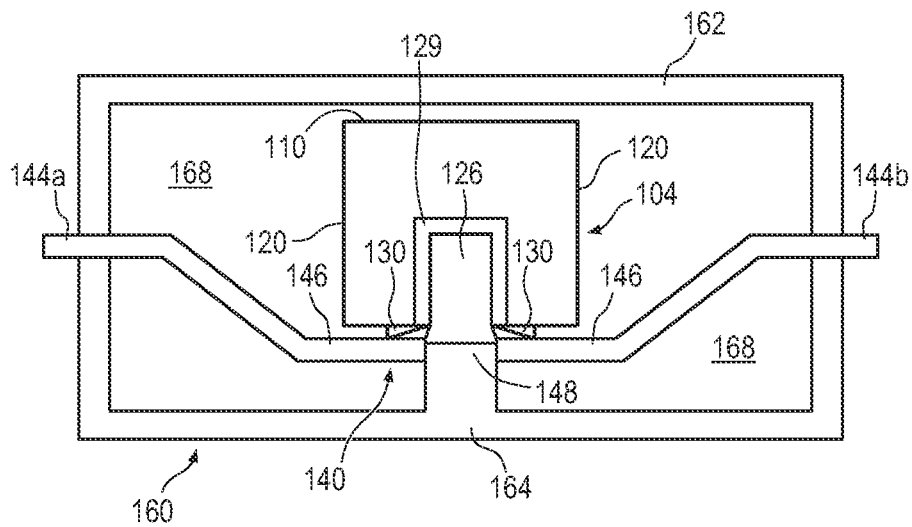

In FIG. 5c, encapsulant or molding compound 168 is injected into chase mold 160 using FAM. Encapsulant 168 can be polymer composite material, such as epoxy resin with filler, epoxy acrylate with filler, or polymer with proper filler. Encapsulant 168 is non-conductive, provides structural support, and environmentally protects the semiconductor device from external elements and contaminants. Encapsulant 168 fills the areas over and around semiconductor die 104 and leadframe 140. Lower mold chase 164 seals off gap 148 directly under cavity 126. Protective layer 130, as disposed around the perimeter of cavity 126, blocks or prevents encapsulant 168 from entering the cavity from the area between back surface 108 and die pad 146 during encapsulation. With protective layer 130, all possible access points for encapsulant 168 to gain entry into cavity 126 during encapsulation have been sealed off. No encapsulant or other contaminants can enter cavity 126 to interfere with sensor region 129. Semiconductor package 170, with encapsulant 168 deposited around semiconductor die 104 and leadframe 140, is removed from mold chase 160 with no encapsulant in cavity 126.

Figure 5D:
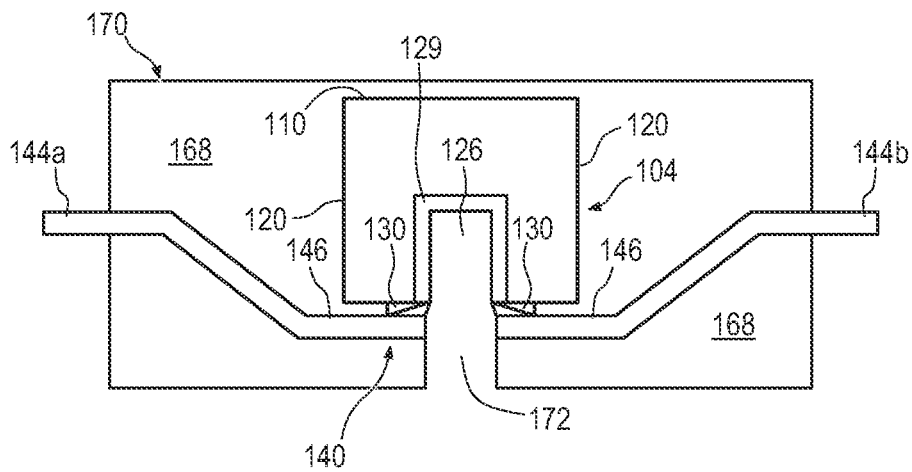
Figure 5E:
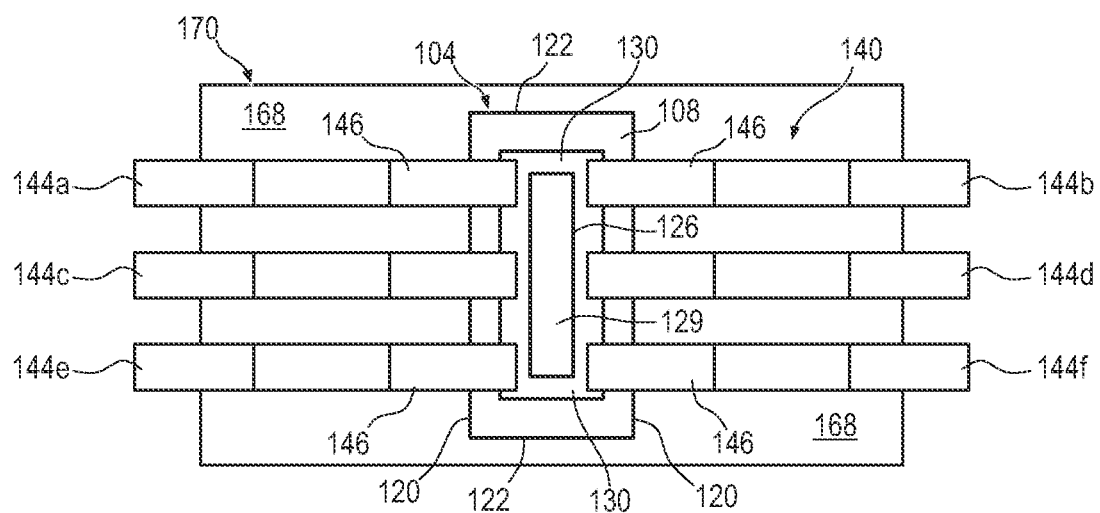

FIG. 5d shows semiconductor package 170 after mold chase 160 is removed. In particular, die pad 146 of leadframe 140, as well as semiconductor die 104, is elevated within encapsulant 168. FIG. 5e shows semiconductor package 170 after removal from mold chase 160. Liquid or gas gains entry into cavity 126 in semiconductor die 104 through opening 172 in semiconductor package 170 to contact sensor region 129. Again, protective layer 130, as disposed around a perimeter of cavity 126, blocks or prevents encapsulant 168 from entering the cavity during encapsulation and interfering with sensor region 129.

Figure 6:
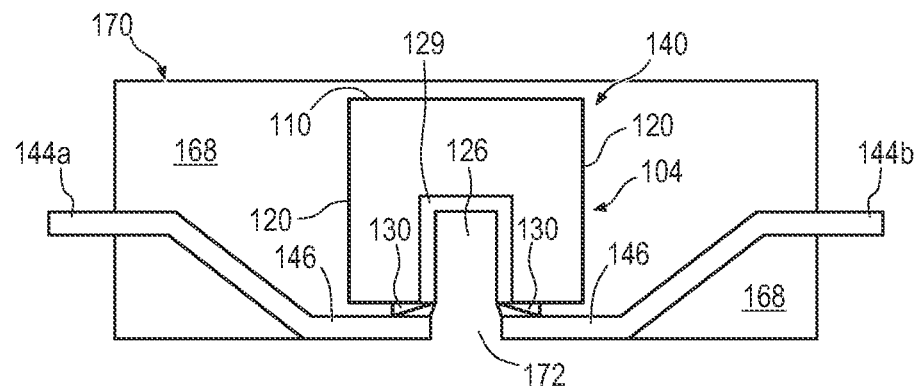
FIG. 6 illustrates the semiconductor package with the leadframe exposed from the encapsulant.
Figure 7:
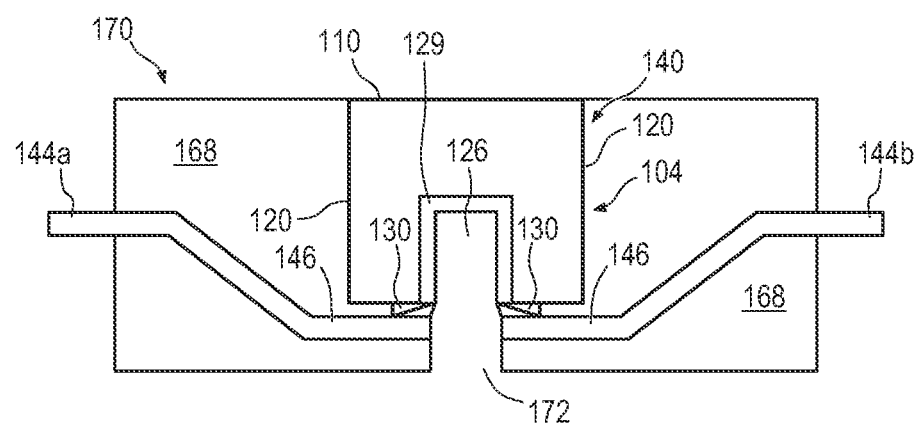
FIG. 7 illustrates the semiconductor package with the leadframe exposed from the encapsulant.
Figure 8:
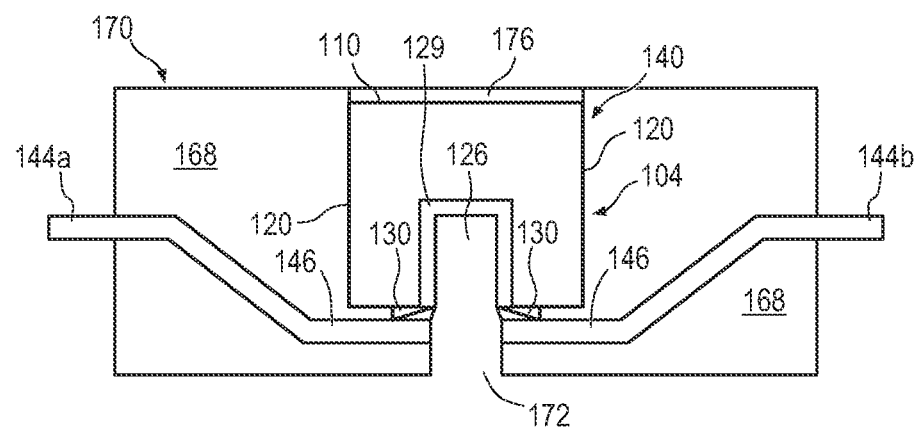
FIG. 8 illustrates the semiconductor package with a damper layer over the semiconductor die and exposed from the encapsulant.

FIG. 6 illustrates an embodiment with die pad 146 of leadframe 140 exposed from encapsulant 168. FIG. 7 illustrates an embodiment with active surface 110 of semiconductor die 104 exposed from encapsulant 168. FIG. 8 illustrates an embodiment, similar to FIG. 7, with damper layer 176, as formed over active surface 110 of semiconductor die 104, exposed from encapsulant 168. In FIG. 9, opening 172 and cavity 126 are oriented downward. In FIG. 10, opening 172 and cavity 126 are oriented upward.

In summary, protection layer 130 blocks or prevents encapsulant 168 from entering cavity 126 during encapsulation. With cavity 126 clear of encapsulant 168, liquid or gas has unobstructed entry into cavity 126 during operation of sensor region 129 in semiconductor package 170. The entry for cavity 126, clear of encapsulant, provides reliable sensor detection and measurement.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    forming a cavity into a first surface of the semiconductor die;
    forming a sensor region within the cavity;
    forming a protective layer on the first surface of the semiconductor die around the cavity; and
    depositing an encapsulant around the semiconductor die, wherein the protective layer blocks the encapsulant from entering the cavity and interfering with the sensor region.

2. The method of claim 1, further including:
    providing a leadframe; and
    disposing the semiconductor die over the leadframe.

3. The method of claim 2, wherein the sensor region is responsive to a property of a liquid or gas.

4. The method of claim 1, wherein the protective layer includes a film.

5. The method of claim 1, wherein the protective layer includes a beveled surface.

6. The method of claim 1, wherein a second surface of the semiconductor die is exposed from the encapsulant.

7. A method of making a semiconductor device, comprising:
    providing a semiconductor die including a cavity;
    forming a sensor region within the cavity;
    forming a protective layer around the cavity; and
    depositing an encapsulant around the semiconductor die, wherein the protective layer blocks the encapsulant from entering the cavity and interfering with the sensor region.

8. The method of claim 7, further including:
    providing a leadframe; and
    disposing the semiconductor die over the leadframe.

9. The method of claim 8, wherein a surface of the leadframe is exposed from the encapsulant.

10. The method of claim 7, wherein the sensor region is responsive to a property of a liquid or gas.

11. The method of claim 7, wherein the protective layer includes a film.

12. The method of claim 7, wherein the protective layer includes a beveled surface.

13. The method of claim 7, wherein a surface of the semiconductor die is exposed from the encapsulant.

14. A semiconductor device, comprising:
    a semiconductor die including a cavity;
    a sensor region formed within the cavity;
    a protective layer formed around the cavity; and
    an encapsulant deposited around the semiconductor die, wherein the protective layer blocks the encapsulant from entering the cavity and interfering with the sensor region.

15. The semiconductor device of claim 14, further including a leadframe, wherein the semiconductor die is disposed over the leadframe.

16. The semiconductor device of claim 15, wherein a surface of the leadframe is exposed from the encapsulant.

17. The semiconductor device of claim 14, wherein the sensor region is responsive to a property of a liquid or gas.

18. The semiconductor device of claim 14, wherein the protective layer includes a film.

19. The semiconductor device of claim 14, wherein the protective layer includes a beveled surface.

20. The semiconductor device of claim 14, wherein a surface of the semiconductor die is exposed from the encapsulant.

* * * * *